United States Patent [19]
West

[11] Patent Number: 5,933,307
[45] Date of Patent: *Aug. 3, 1999

[54] PRINTED CIRCUIT BOARD SPARKGAP

[75] Inventor: Charles E. West, Hendricks, Ind.

[73] Assignee: Thomson Consumer Electronics, Inc., Indianapolis, Ind.

[*] Notice: This patent issued on a continued prosecution application filed under 37 CFR 1.53(d), and is subject to the twenty year patent term provisions of 35 U.S.C. 154(a)(2).

[21] Appl. No.: 08/603,050

[22] Filed: Feb. 16, 1996

[51] Int. Cl.⁶ ................................... H02H 9/00
[52] U.S. Cl. .............................. 361/56; 361/91
[58] Field of Search ............... 361/56, 91, 111, 361/118, 119, 130, 212, 748, 760, 777; 174/260

[56] References Cited

U.S. PATENT DOCUMENTS 4,322,777  3/1982  Ueta et al. ........................... 361/748

*Primary Examiner*—Ronald W. Leja
*Attorney, Agent, or Firm*—Joseph S. Tripoli; Peter M. Emanuel; Robert D. Shedd

[57] ABSTRACT

A printed circuit board (PCB) sparkgap utilizing one or more surface mount devices (SMDs) wherein the conductive ends and solder fillets of the SMDs form one or more conductive electrodes of the spark gap and the SMDs help absorb electrical and thermal energy during an arc-over.

16 Claims, 4 Drawing Sheets

PRINTED CIRCUIT BOARD SPARKGAP

FIELD OF THE INVENTION

This invention relates to sparkgaps for protecting electrical circuits and especially sparkgaps associated with a printed circuit board.

BACKGROUND OF THE INVENTION

A sparkgap intended to protect a circuit from the damaging effects of a high voltage surge by providing a shunting path for the surge prior to the circuit. The sparkgap determines the point within the circuit for transient or surge discharge and determines the specific potential of such a discharge. The location of desired discharge is determined by the circuitry involved, the source of such transients and the preferred discharge path. The differential voltage necessary for discharge is determined by the spacing between the two conductive points comprising the sparkgap. The required discharge potential is established by determining the transient or surge sources and the protection level desired, which, for example, may be determined by regulatory requirements.

Prior spark gap technologies include discrete sparkgaps (FIGS. 1A and 1B) or the more cost effective printed circuit board (PCB) sparkgaps (FIGS. 2A and 2B).

Discrete sparkgaps are generally constructed with leads terminating within a body of glass, ceramic or plastic at respective conductive surfaces with a fixed spacing therebetween. There are two categories of discrete spark gaps, one sealed with a controlled atmosphere as shown in FIG. 1A, and the other, unsealed at normal atmosphere as shown in FIG. 1B. Both of these types require a sizable amount of room for mounting (e.g., on a PCB) and both require careful physical placement and orientation during mounting due to spacing and other mechanical considerations. Discrete spark gaps, while tending to be more costly than printed circuit spark gaps, are somewhat more durable and normally exhibit a more controlled discharge potential.

It is well known to construct printed circuit boards (PCBs) comprising one or more layers of a rigid or flexible insulator (e.g., fiberglass or plastic) and one or more layers of a conductive material (e.g., copper or conductive ink) where various circuit components are electrically connected by conductive "traces."

As shown in FIGS. 2A and 2B, a PCB sparkgap utilizes conductive traces (e.g., copper) of the PCB which are positioned at a fixed distance from each other and a provide a controlled point for discharge of the unwanted transient or potential. The PCB sparkgap may have a slot punched in the board laminate between the nodes, depending upon the voltage potentials and energy involved. PCB sparkgaps are relatively easy to accurately and repetitively manufacture since there are few variables introduced through physical tolerancing and placement (in contrast to discrete sparkgaps). PCB sparkgaps provide predictable operation and are relatively inexpensive, costing perhaps little more than the actual cost of the board material.

A disadvantage of the printed circuit board sparkgap is evident upon repeated discharges, catastrophic events, or long term constant discharge. In these situations the printed circuit board surface and the copper foil quickly degrade with respect to the spacing between conductive nodes due to vaporization of foil. As the gap spacing increases the voltage potential required for an arc across the gap increases and the location of the arc may be less controlled. Additionally, the board laminate may sustain damage during catastrophic and long term discharge due to the intense heat which may result from such an event.

There are several techniques useful in improving the PCB sparkgap. For example, the problems associated with foil vaporization may be delayed by increasing the foil thickness or, in a PCB slot type of sparkgap, by increasing the length of the slot (while retaining the same width). Unfortunately, the area of the PCB required to implement a sparkgap increases with this technique and the vaporization will eventually degrade performance. Another technique is the use of multiple gaps spaced serially such that the energy of the spark is dissipated over two gaps (FIG. 2B). This technique also slows foil degradation at the expense of PCB area.

It is therefore seen to be desirable to provide a spark gap which eliminates or reduces the previously described limitations of prior art sparkgaps.

SUMMARY OF THE INVENTION

This invention concerns an improvement to the type of PCB sparkgap described above which utilizes surface mount devices (SMDs) which are oriented end-on to one another and soldered to respective PCB conductors of the spark gap.

BRIEF DESCRIPTION OF THE DRAWINGS

The invention will be described with reference to the accompanying Drawing, in which.

Like reference designation in the various Figures refer to the same or similar elements.

DETAILED DESCRIPTION

Figure 3A:
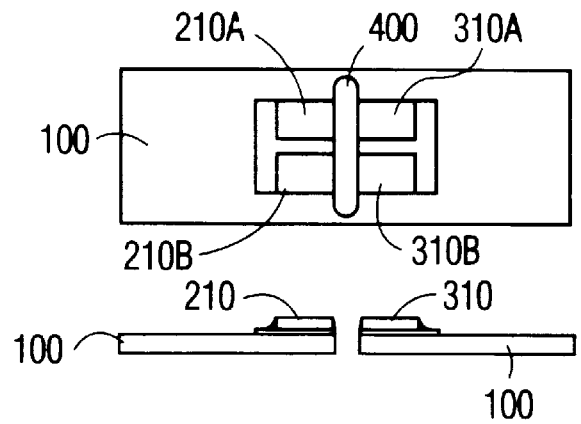
FIG. 3A shows the plan and side view of a preferred embodiment of the invention.
Figure 5A:
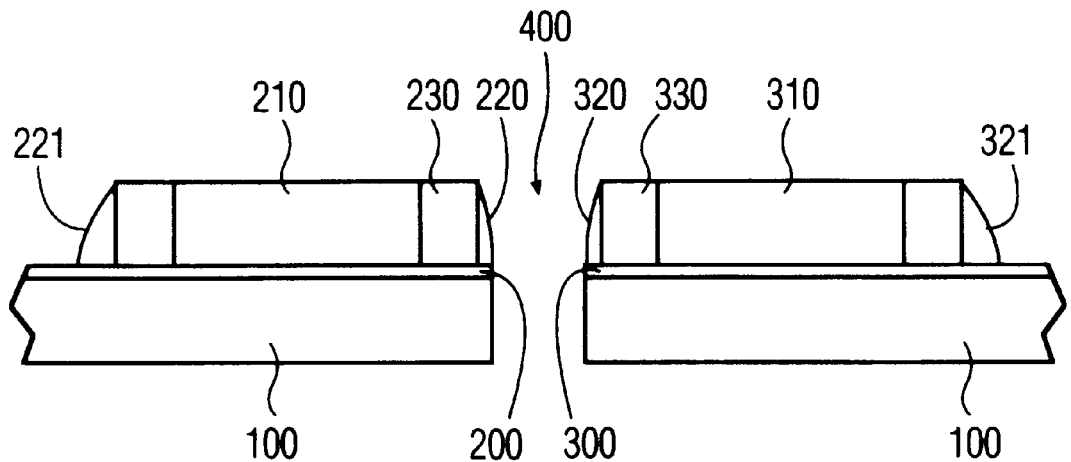
FIG. 5 shows the plan and side view of the preferred embodiment of the invention shown in FIG. 3A.
Figure 5B:
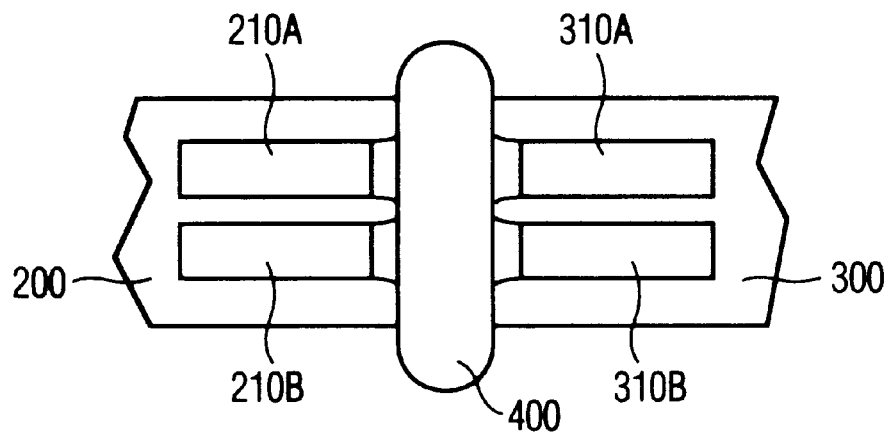

Referring to FIGS. 3A and 5, an embodiment of PCB sparkgap according to the teachings of the invention is illustrated. The PCB includes a non-conductive substrate or laminate 100 and a conductive layer including conductors 200 and 300 formed on laminate 100. Conductors 200 and 300 are spaced apart and electrically isolated from one another to form a spark gap 400. Spark gap 400 is enhanced by the addition of surface mount devices (SMDs) 210 and 310 which have been soldered to conductors 200 and 300, respectively. Gap 400 as illustrated includes a slot punched through laminate 100. However, it is not necessary for the practice of the invention to punch such a slot. SMD 210 is electrically and mechanically connected to conductor 200 via solder fillet 220 and solder fillet 221 at conductive ends 230 and 231. SMD 310 is electrically and mechanically connected to conductor 300 via solder fillet 320 and solder fillet 321 at conductive ends 230 and 231.

The actual gap 400 across which the electrical energy in the form of a spark will travel is formed initially by the space between conductors 200 and 300. These conductors may experience some vaporization such that they erode to where the gap is formed between SMD 210 and SMD 310. The amount of conductor between an SMD and the edge of the conductor is determined by the placement tolerance of the SMD process used and the formation of the solder fillets.

A first electrode of spark gap 400 is formed by conductor 200 and solder fillet 220 and a second electrode is formed by conductor 300 and solder fillet 320. A spark will jump from one electrode to the other when the differential voltage potential between the two electrodes exceeds a level dependent upon the width of the gap and the dielectric strength of the material (e.g., air in the case of a slot, or fiberglass). The conductive foil between SMD 210 or 310 may be shaped to provide a defined point such that solder fillets 220 and 320 flow into this shape. In this manner the location of arcing and consequently the differential voltage level required to induce arcing may be more tightly controlled. This defined point encourages discharge at the desired potential and location, in contrast to a rounded or broad discharge surface which will be less controlled.

Considering only the first electrode, the electrical energy presented to the electrode due to arc-over will be dissipated by conductor 200, solder fillet 220 and conductive end 230 of SMD 210. In addition, heat generated by (among other factors) the $I^2R$ losses within the conductive materials of the electrode will be transferred to any adjacent materials, such as SMD 210 and laminate 100.

Figure 2A:
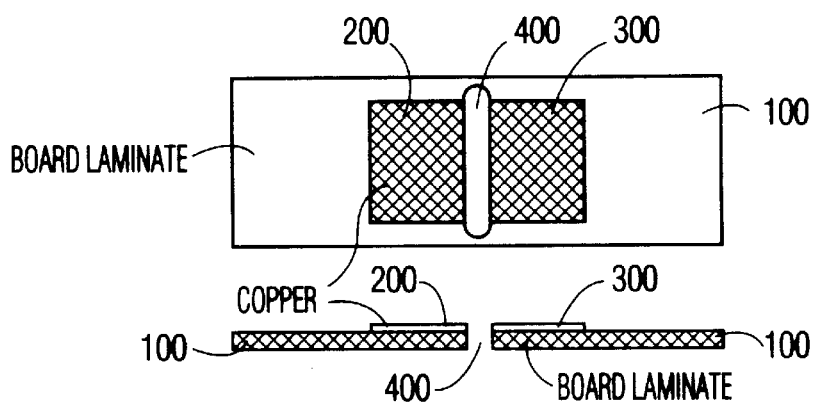
Figure 2B:
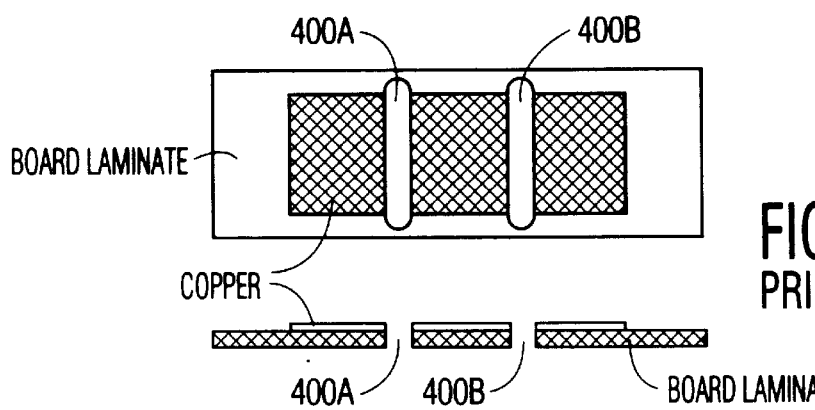

In the prior art spark gap of FIG. 2A, the electrical and thermal energies would be dissipated by the copper and laminate alone, resulting in erosion of conductor and laminate, as previously described. By using surface mount devices, and their associated solder fillets and conductive ends, the mass available to absorb the heat from the copper is increased and the damage to the copper and adjacent laminate is minimized. In addition, the larger cross sectional area provided by the solder fillets and conductive ends directly reduces $I^2R$ losses by lowering the resistance to current flow during an arc-over, thereby reducing the amount of heat generated.

The invention may be practiced with, as illustrated in the Drawings, or without the "short circuiting" of SMD 210 and SMD 310 by conductors 200 and 300 respectively. However, the additional copper under the SMDs provides additional protection by both lowering electrical resistance (i.e., lower $I^2R$ losses) and increasing thermal mass (i.e., absorbing more heat without damage). Further increases in thermal mass may be realized by using different solder compounds. For example, a particular solder compound might be selected because of its high specific heat characteristic. A particular solder compound might also be selected because of a particular flow or cure characteristic, whereby an unusually thick solder joint might be formed.

The SMDs used may be soldered to the coppers layers of a PCB using the standard techniques and tolerances. For example, wave or reflow methods, vapor phase and infra-red techniques. In addition, the actual component type of SMD used is not critical where the device is "short circuited" as described above. Where the device is not "short circuited," component selection is more important and a low impedance component (e.g., a jumper type of SMD) is an appropriate selection. As a practical matter, it has been found that SMD resistors tend to be more mechanically solid than SMD capacitors and are therefore more desirable, but either may be used. In a similar manner, the tolerance of the device selected is not critical. As such electrically rejected parts may still be used if they retain suitable mechanical characteristics (i.e., not cracked, etc . . . ). In addition, SMDs need not be specifically stocked for use in spark gaps, and SMDs ordered for other purposes may be employed.

Figure 3B:
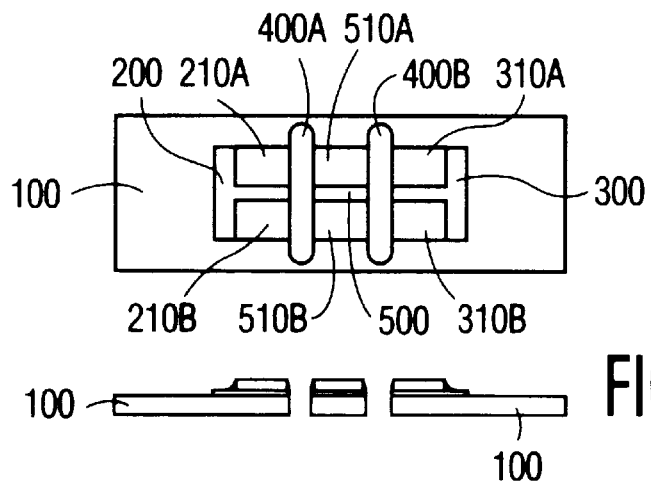
FIG. 3B shows the plan and side view of an alternate embodiment of the invention.
Figure 4:
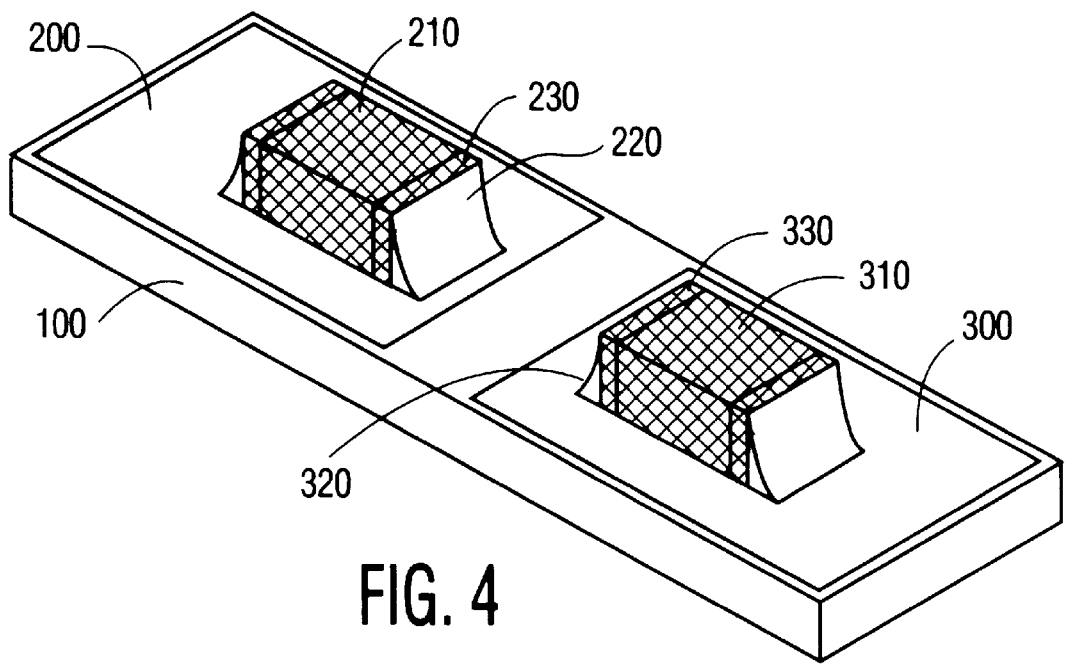
FIG. 4 shows an isometric view of an embodiment of the invention.

The invention may also be practiced using the configuration of FIG. 4, where two opposing SMDs are used to form sparkgap 400. Variations of the arrangement of FIG. 4 are shown in FIGS. 3A and 3B. FIG. 3A shows a first pair 210A,B of SMDs mounted on first conductor 200 opposing a second pair 310A,B of SMDs mounted on second conductor 300, with sparkgap 400 comprising the two opposing SMD pairs. This configuration provides some redundancy wherein there are two defined surfaces for arc-over. By providing two of such surfaces the durability of the sparkgap is increased since any significant degradation in the defined surfaces of one set of opposing SMDs will eventually result in arcing between the other set of opposing SMDs.

FIG. 3B shows a further enhancement of the arrangement shown in FIG. 3A. A third pair 510A,B of SMDs mounted on a third conductor 500 between the first 210A,B and second pairs 310A,B of SMDs mounted, forming a second sparkgap 400B. This arrangement allows for a division of the arc-over energy between the two gaps 400A and 400B, thereby reducing the stresses on the individual elements comprising the sparkgaps. For example, assuming identical arc-over voltages, the single spark gap in the arrangement of FIG. 3A will necessarily be wider than either of the two spark gaps in the arrangement of FIG. 3B and the thermal and electrical energies dissipated will be dissipated by fewer components in the arrangement of FIG. 3A. Therefore, the arrangement of FIG. 3B allows higher energy sparking than the arrangement of FIG. 3A without increasing the degradation of the associated components.

Figure 6A:
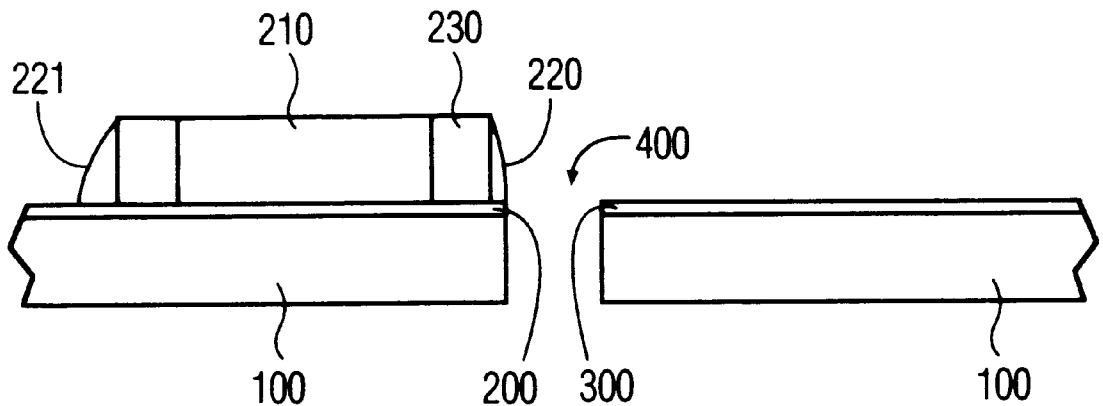
FIG. 6 shows the plan and side view of another alternate embodiment of the invention.
Figure 6B:
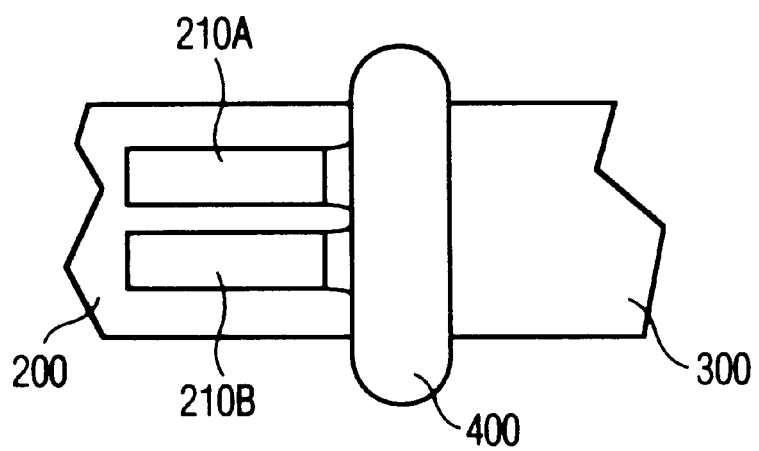

The invention may also be practiced using the configuration of FIG. 6, where a first 210A SMD and, optionally, a second 210B SMD are mounted on first conductor 200 opposing a second conductor 300. The sparkgap 400 comprises the gap between the first conductor, including the conductive surfaces of the one or more SMDs mounted to it, and the second conductor. This embodiment improves upon the prior art by providing increased protection from arc-induced damage to one side of the spark gap.

Figure 1A:
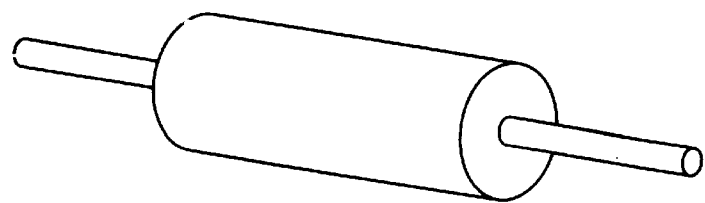
FIGS. 1A,1B and 2A,2B, previously referred to, show sparkgaps of the type known in the prior art.
Figure 1B:
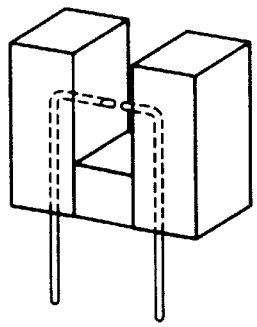

When compared to prior PCB spark gaps, cost increases will be minimal, essentially consisting of the cost of two or more SMDs and their placement on the PCB. In addition, the use of SMDs instead of the discrete spark gap of FIG. 1A takes advantage of the benefits of surface mounting techniques (e.g., accurate and repeatable component placement, etc . . . ).

The SMD placement should been chosen such that the worst case combination of mechanical tolerance and placement errors of the selected placing/soldering process will guarantee that there is always to be some amount of conductor uncovered by the component at the gap edge. The purpose of this placement is to both guarantee solder connection and a defined point for initial discharge start.

A sparkgap may be constructed using either 805 or 1206 SMD components. For example, tests conducted on an embodiment of the invention as shown in FIG. 3A having SMD pair end to end placement accuracy of approximately ±5 mil and side to side (center-line to center-line) clearance of approximately 100 mil have provided good results. The placement process guidelines call for 20 mils of copper beyond the end of a SMD, although this distance may be decreased depending on, for example, the level of protection sought.

Due to SMD mounting process factors (e.g., adjacent component solder) side to side center line clearancing should adhere to 90 mil center-line to center-line for the 805 size SMD and 100 mil center-line to center-line for the 1206 size SMD. The end clearance required to achieve a 5 mil solder fillet also provides ample electrical and mechanical connection.

Experiments including repetitive transients and surges of performed upon the arrangement of FIG. 3A with the above physical dimensioning have been performed with very satisfactory results. Testing conducted consisted of over 20 surges @ 6 KV and 0.51 uf using jumper type SMDs. The conductor was found to have suffered virtually no degradation. Similar experiments performed on the prior art arrangement of FIG. 2A resulted in significant degradation of copper. The inventive sparkgap has been shown to be useful as both a transient and a continuous discharge device.

It will be apparent to those skilled in the art, that although the invention has been described in terms of specific examples, modifications and changes may be made to the disclosed embodiments without departing from the essence of the invention. It is, therefore, to be understood, that the appended claims are intended to cover all modifications which naturally flow from the foregoing treatise and examples.

I claim:

1. A printed circuit board sparkgap comprising:
   first and second conductive traces disposed upon a surface of a printed circuit board; and
   first and second surface mount devices disposed upon said first and second conductive traces, respectively, each said surface mount device comprising a first substantially planar surface adapted to be mounted against a respective one of said conductive traces,
   said conductive traces separated from each other by a predetermined distance and cooperating to form a gap therebetween for discharging excessively high energies, said first and second surface mount devices being separated by a distance greater than the predetermined distance between said conductive traces and being positioned in proximity to said gap such that said surface mount devices are able to absorb and dissipate heat generated during an arc-over and thereby minimize damage to electrical circuits on the circuit board while maintaining a defined point for discharge between the first and second electrical traces.

2. The printed circuit board sparkgap according to claim 1, wherein each of said first and second surface mount devices are secured to said respective conductive traces by first and second solder fillets, respectively.

3. The printed circuit board sparkgap according to claim 1, wherein said first and second surface mount devices comprise one of surface mount resistors and surface mount capacitors.

4. The printed circuit board sparkgap according to claim 1, wherein each said surface mount device further comprises a second substantially planar surface, each said second planar surface disposed substantially orthogonal to each said respective first planar surface.

5. The printed circuit board sparkgap according to claim 1, wherein said conductive traces are separated from each other by an open air gap on said printed circuit board surface.

6. The method of claim 1, wherein said first and second surface mount devices comprise one of 805 size surface mount device (SMDI) components and 1206 size SMD components on the first and second conductive traces.

7. A sparkgap comprising:
   a mounting member having first and second surface areas separated by an opening on said mounting member;
   first and second conductive traces disposed on said first and second surface areas, respectively; and
   a first surface mount device disposed upon said first conductive trace, said first surface mount device comprising a first substantially planar surface adapted to be mounted against said first conductive trace, said first conductive trace cooperating with said second conductive trace to form therebetween a gap susceptible to electrical arcing whereby said first surface mount device is positioned in proximity to said gap such that said first surface Mount device is able to absorb heat generated during electrical arcing while maintaining a defined point for discharge between the first and second electrical traces.

8. The sparkgap according to claim 7 wherein said first surface mount device is secured to said first conductive trace by a first solder fillet, said first solder fillet cooperating with said second conductive trace to form therebetween a gap susceptible to electrical arcing.

9. The sparkgap according to claim 7, wherein said first surface mount device comprises one of a surface mount resistor and a surface mount capacitor.

10. The sparkgap according to claim 7, further comprising a second surface mount device disposed on said second conductive trace, said second surface mount device comprising a second substantially planar surface adapted to rest against said second conductive trace .

11. The sparkgap according to claim 10, wherein each of said first and second surface mount devices further respectively comprise a third and fourth substantially planar surfaces respectively disposed substantially orthogonal to said first and second planar surfaces.

12. A method for making a sparkgap on a mounting member comprising the steps of:
   forming an opening on the mounting member to thereby form a first surface portion separated from a second surface portion by the opening;
   securing first and second conductive traces on the first and second surface portions, respectively, whereby the first and second conductive traces are separated from each other by a predetermined distance and cooperate to form a gap susceptible to electrical arcing;
   placing first and second surface mount devices each having a substantially planar surface on the first and second conductive traces, respectively, and substantially adjacent the gap; and
   securing the first and second surface mount devices to the first and second conductive traces by one of wave and reflow soldering methods, whereby said first and second surface mount devices are positioned in proximity to said gap such that said surface mount devices are able to absorb heat generated during electrical arcing while maintaining a defined point for discharge between the first and second electrical traces.

13. The method of claim 12, wherein said placing step comprises placing one of surface mount resistors and surface mount capacitors on the first and second conductive traces.

14. The method of claim 12, wherein said placing step comprises placing one of 805 size surface mount device (SMD) components and 1206 size SMD components on the first and second conductive traces.

15. A method of forming a sparkgap on an existing printed circuit board including first and second conductive traces positioned thereon and separated from each other by a predetermined distance comprising the steps of:

placing first and second surface mount devices each having a substantially planar surface on the first and second conductive traces, respectively, substantially adjacent the gap and separated by a distance greater than the predetermined distance; and securing the first and second surface mount devices to the first and second conductive traces, whereby the first and second conductive traces cooperate to form a gap susceptible to electrical arcing and the first and second surface mount devices are able to absorb heat generated during electrical arcing while maintaining a defined point for discharge between the first and second electrical traces.

16. A printed circuit board sparkgap comprising:

first and second conductive traces disposed upon a surface of a printed circuit board, said conductive traces separated from each other by a predetermined distance and cooperating to form a gap therebetween for discharging excessively high energies;

a first surface mount device being a resistor or a capacitor disposed upon said first conductive trace and substantially adjacent said gap; and a second surface mount device being a resistor or a capacitor disposed upon said second conductive trace and substantially adjacent said gap, whereby the first and second conductive traces cooperate to form a gap susceptible to electrical arcing and the first and second surface mount devices are able to absorb heat generated during electrical arcing while maintaining a defined point for discharge between the first and second electrical traces.

* * * * *